(12) United States Patent
Xiang

(10) Patent No.: US 11,979,984 B2
(45) Date of Patent: May 7, 2024

(54) SPLICING DISPLAY SCREEN

(71) Applicant: TCL CHINA STAR OPTOELECTRONICS TECHNOLOGY CO., LTD., Shenzhen (CN)

(72) Inventor: Changming Xiang, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 806 days.

(21) Appl. No.: 17/053,735

(22) PCT Filed: Sep. 8, 2020

(86) PCT No.: PCT/CN2020/113888
§ 371 (c)(1),
(2) Date: Nov. 6, 2020

(87) PCT Pub. No.: WO2022/032778
PCT Pub. Date: Feb. 17, 2022

(65) Prior Publication Data
US 2023/0053694 A1  Feb. 23, 2023

(30) Foreign Application Priority Data
Aug. 10, 2020 (CN) .................. 202010797040.9

(51) Int. Cl.
*H05K 1/11* (2006.01)
(52) U.S. Cl.
CPC ... *H05K 1/112* (2013.01); *H05K 2201/10106* (2013.01); *H05K 2201/10128* (2013.01)

(58) Field of Classification Search
CPC ......... H05K 1/112; H05K 2201/10106; H05K 2201/10128
(Continued)

(56) References Cited

U.S. PATENT DOCUMENTS 10,656,447 B2 *  5/2020  Teramoto ............ G02F 1/13452
2006/0244721 A1 * 11/2006  Wang .................... G06F 1/1601
345/156
(Continued)

FOREIGN PATENT DOCUMENTS

CN   101194218 A  *  4/2008
CN   103646613 A     3/2014
(Continued)

OTHER PUBLICATIONS

International Search Report in International application No. PCT/CN2020/113888, dated Apr. 26, 2021.
(Continued)

Primary Examiner — Andargie M Aychillhum
(74) Attorney, Agent, or Firm — PV IP PC; Wei Te Chung; Zhigang Ma

(57) ABSTRACT

A splicing display screen is provided. The splicing display screen includes a circuit board, a plurality of display panels, and a plurality of first metal lines. The circuit board includes a plurality of circuit areas, and each of the circuit areas includes one of mounting areas and one of electrical connection areas. A plurality of first metal parts are disposed in the electrical connection areas. The display panels are disposed on the circuit board and positioned in the mounting areas, and metal connection pads on the display panels are electrically connected to the first metal parts by the first metal lines.

20 Claims, 2 Drawing Sheets

(58) Field of Classification Search
USPC .......................................................... 361/767
See application file for complete search history.

(56) References Cited

U.S. PATENT DOCUMENTS

| | | |
|---|---|---|
| 2016/0238785 A1 | 8/2016 | Park |
| 2019/0204674 A1 | 7/2019 | Jing |
| 2020/0168697 A1 | 5/2020 | Jang |

FOREIGN PATENT DOCUMENTS

| | | | |
|---|---|---|---|
| CN | 103907190 A | | 7/2014 |
| CN | 103917071 A | | 7/2014 |
| CN | 104464533 A | | 3/2015 |
| CN | 105138195 A | | 12/2015 |
| CN | 106252380 A | | 12/2016 |
| CN | 106887525 A | | 6/2017 |
| CN | 107402466 A | | 11/2017 |
| CN | 108181752 A | | 6/2018 |
| CN | 108417606 A | | 8/2018 |
| CN | 108777114 A | | 11/2018 |
| CN | 109448572 A | | 3/2019 |
| CN | 109461386 A | | 3/2019 |
| CN | 109461386 A * | 3/2019 | ............... G09F 9/33 |
| CN | 109461403 A | | 3/2019 |
| CN | 109768027 A | | 5/2019 |
| CN | 109904186 A | | 6/2019 |
| CN | 110021239 A | | 7/2019 |
| CN | 110112171 A | | 8/2019 |
| CN | 110164901 A | | 8/2019 |
| CN | 110379314 A | | 10/2019 |
| CN | 110379322 A | | 10/2019 |
| CN | 110597038 A | | 12/2019 |
| CN | 110707121 A | | 1/2020 |
| CN | 110727314 A | | 1/2020 |
| CN | 110931540 A | | 3/2020 |
| CN | 110942726 A | | 3/2020 |
| CN | 111028682 A | | 4/2020 |
| CN | 111028697 A | | 4/2020 |
| CN | 111128051 A | | 5/2020 |
| CN | 111208673 A | | 5/2020 |
| CN | 111276058 A | | 6/2020 |
| CN | 111292621 A | | 6/2020 |
| CN | 111448539 A | | 7/2020 |
| CN | 111462638 A | | 7/2020 |
| CN | 111463228 A | | 7/2020 |
| IN | 110718570 A | | 1/2020 |
| KR | 20200004751 A | | 1/2020 |

OTHER PUBLICATIONS

Written Opinion of the International Search Authority in International application No. PCT/CN2020/113888, dated Apr. 26, 2021.
Chinese Office Action issued in corresponding Chinese Patent Application No. 202010797040.9 dated Mar. 3, 2021, pp. 1-6.
Chinese Office Action issued in corresponding Chinese Patent Application No. 202010797040.9 dated Jun. 2, 2021, pp. 1-7.
Chinese Office Action issued in corresponding Chinese Patent Application No. 202010797040.9 dated Oct. 9, 2021, pp. 1-6.
Notification to Grant Patent Right for Invention issued in corresponding Chinese Patent Application No. 202010797040.9 dated Jan. 6, 2022, pp. 1-4.

* cited by examiner

SPLICING DISPLAY SCREEN

This application is a National Phase of PCT Patent Application No. PCT/CN2020/113888 having international filing date of Sep. 8, 2020, which claims priority to Chinese Patent Application No. 202010797040.9, filed on Aug. 10, 2020, the entire contents of which are incorporated by reference in this application.

FIELD OF INVENTION

The present disclosure relates to the field of display technologies, and more particularly, to a splicing display screen.

BACKGROUND OF INVENTION

At present, all conventional display screens need a bonding module technique by chip on films or flexible circuit boards to input signals required by panels into planes. Since in panel designs, in-plane signal lines usually need to be bundled first in fan-shaped areas and then concentrated to a small bonding area, a chip on film or a flexible circuit board is bonded in the bonding area to form an electrical connection between a printed circuit board and a glass substrate, so a width of the bonding area is usually larger. Further, when the bonding area is overly large, appearances of display screens will be affected. If used in splicing screens, there will be obvious seams, thereby affecting splicing display effect. Since polyimide, a base material of the chip on film or the flexible circuit board, has good resilience and is not easy to bend, it will also increase seams, thereby affecting the splicing display effect.

Technical problem: the present disclosure provides a splicing display screen to solve a problem of splicing display screens having overly large seams in current technology, thereby improving display effect of the splicing display screen.

SUMMARY OF INVENTION

An embodiment of the present disclosure provides a splicing display screen which includes:
 a circuit board having a plurality of circuit areas, wherein each of the circuit areas includes one of mounting areas and one of electrical connection areas, and a plurality of first metal parts are disposed in the electrical connection areas;
 a plurality of display panels disposed on the circuit board and positioned in the mounting areas, wherein each of the display panels includes one of metal connection pads disposed on a display surface of each of the display panels; and
 a plurality of first metal lines, wherein the metal connection pads are electrically connected to the first metal parts by the first metal lines.

In the splicing display screen provided in the present disclosure, the splicing display screen further includes a plurality of adhesive parts disposed in the mounting areas of the circuit board and attached between the circuit board and the display panels.

In the splicing display screen provided in the present disclosure, the circuit board further includes a bonding area disposed on one side of the circuit board, and a plurality of second metal parts are disposed in the bonding area.

In the splicing display screen provided in the present disclosure, the splicing display screen further includes at least one chip on film bonded in the bonding area and electrically connected to the second metal parts.

In the splicing display screen provided in the present disclosure, the splicing display screen further includes a sealing layer covering the circuit board, the display panels, the first metal parts, and the first metal lines.

In the splicing display screen provided in the present disclosure, a distance between two of the display panels adjacent to each other ranges from 7 µm to 50 µm.

In the splicing display screen provided in the present disclosure, each of the display panels includes a substrate and a plurality of light-emitting diodes disposed on the substrate.

In the splicing display screen provided in the present disclosure, a thickness of the adhesive parts ranges from 100 µm to 200 µm.

In the splicing display screen provided in the present disclosure, a thickness of the first metal parts ranges from 0.2 µm to 0.5 µm.

In the splicing display screen provided in the present disclosure, a diameter of the first metal lines ranges from 1 µm to 49 µm.

In the splicing display screen provided in the present disclosure, the splicing display screen further includes a plurality of via holes penetrating through the circuit board and exposing the display panels, and the via holes are positioned in the mounting areas.

In the splicing display screen provided in the present disclosure, the splicing display screen further includes at least one chip on film disposed on one side of the circuit board away from the display panels.

In the splicing display screen provided in the present disclosure, the splicing display screen further includes a plurality of second metal lines disposed on the circuit board and in the via holes, and the second metal lines are electrically connected to the first metal parts and the at least one chip on film.

In the splicing display screen provided in the present disclosure, the splicing display screen further includes a plurality of through-holes penetrating through the circuit board, and the through-holes are positioned in the bonding area.

In the splicing display screen provided in the present disclosure, the splicing display screen further includes a plurality of second metal lines disposed on the circuit board and in the through-holes, and the second metal lines are electrically connected to the second metal parts and the at least one chip on film.

Beneficial effect: the present disclosure provides the splicing display screen. The splicing display screen includes the circuit board, the plurality of display panels, and the plurality of first metal lines. The circuit board includes the plurality of circuit areas, and each of the circuit areas includes one of the mounting areas and one of the electrical connection areas. The plurality of first metal parts are disposed in the electrical connection areas. The display panels are disposed on the circuit board and positioned in the mounting areas, each of the display panels includes one of the metal connection pads disposed on the display surface of each of the display panels, and the metal connection pads are electrically connected to the first metal parts by the first metal lines. Gaps of seams can be reduced by the first metal lines electrically connecting the metal connection pads on the display panels to the first metal parts on the circuit board.

DESCRIPTION OF DRAWINGS

The accompanying figures to be used in the description of embodiments of the present disclosure will be described in brief to more clearly illustrate the technical solutions of the embodiments. Obviously, the accompanying figures described below are only part of the embodiments of the present disclosure, from which those skilled in the art can derive further figures without making any inventive efforts.

DETAILED DESCRIPTION OF PREFERRED EMBODIMENTS

The technical solutions in the embodiments of the present disclosure will be clearly and completely described below with reference to the drawings in the embodiments of the present disclosure. Obviously, the described embodiments are only a part of the embodiments of the present disclosure, but not all the embodiments. Based on the embodiments in the present disclosure, all other embodiments obtained by those skilled in the art without creative efforts are within the scope of the present disclosure.

Figure 1:
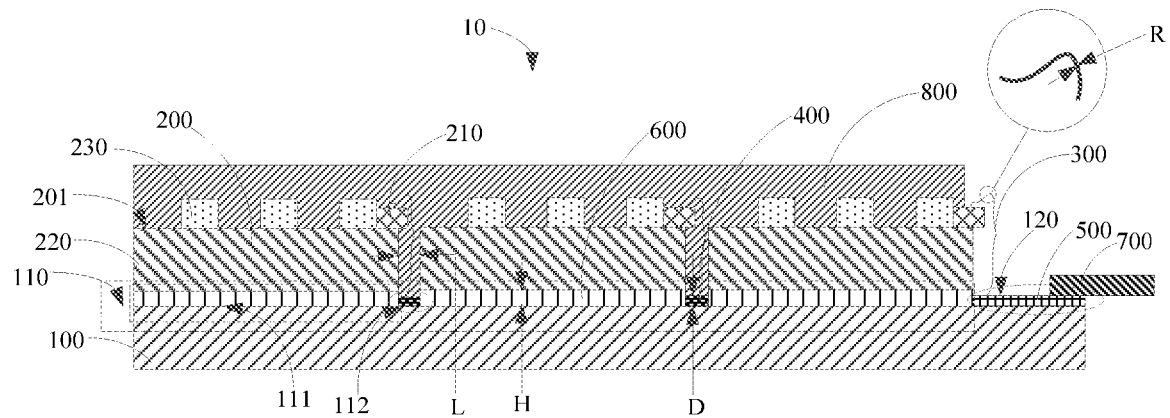
FIG. 1 is a first schematic cross-sectional structural diagram of a splicing display screen according to an embodiment of the present disclosure.

Referring to FIG. 1, FIG. 1 is a first schematic cross-sectional structural diagram of a splicing display screen according to an embodiment of the present disclosure. A splicing display screen 10 is provided in the present disclosure. The splicing display screen 10 includes a circuit board 100, a plurality of display panels 200, and a plurality of first metal lines 300.

The circuit board 100 includes a plurality of circuit areas 110 and a bonding area 120. Each of the circuit areas 110 includes one mounting area 111 and one electrical connection area 112. A plurality of first metal parts 400 are disposed in electrical connection areas 112. A thickness D of the first metal parts 400 ranges from 0.2 μm to 0.5 μm. Specifically, the thickness D of the first metal parts 400 may be 0.24 μm, 0.3 μm, or 0.45 μm. The bonding area 120 is disposed on one side of the circuit board 100. A plurality of second metal parts 500 are disposed in the bonding area 120.

In an embodiment of the present disclosure, the splicing display screen 10 further includes a plurality of adhesive parts 600. The adhesive parts 600 are disposed in the mounting areas 111 of the circuit board 100. A thickness H of the adhesive parts 600 ranges from 100 μm to 200 μm. The thickness H of the adhesive parts 600 may be 103 μm, 135 μm, 187 μm, or 196 μm.

Each of the display panels 200 is attached to one of the adhesive parts 600. Each of the display panels 200 includes one of metal connection pads 210 disposed on a display surface 201 of each of the display panels 200. A distance L between two of the display panels 200 adjacent to each other ranges from 7 μm to 50 μm. Specifically, the distance L between the two of the display panels 200 adjacent to each other may be 8 μm, 20 μm, 27 μm, 39 μm, or 47 μm. Each of the display panels 200 includes a substrate 220 and a plurality of light-emitting diodes 230. The light-emitting diodes 230 are disposed on the substrate 220 in an array. A device structure can be more compact by using the adhesive parts to attach the display panels onto the circuit board.

In an embodiment of the present disclosure, the splicing display screen 10 further includes at least one chip on film 700. The at least one chip on film 700 is bonded in the bonding area 120 and is electrically connected to the second metal parts 500.

The metal connection pads 210 are electrically connected to the first metal parts 400 by the first metal lines 300. The metal connection pads 210 are electrically connected to the second metal parts 500 by the first metal lines. A diameter R of the first metal lines 300 ranges from 1 μm to 49 μm. The diameter R of the first metal lines 300 may be 8 μm, 27 μm, 31 μm, 42 μm, or 45 μm.

In an embodiment of the present disclosure, the splicing display screen 10 further includes a sealing layer 800. The sealing layer 800 covers the circuit board 100, the display panels 200, the first metal parts 400, and the first metal lines 300.

In the present disclosure, the first metal parts are electrically connected to the metal connection pads on the display panels by the first metal lines, and drive signals are input into planes and output by the chip on film on the circuit board to drive the display panels to work normally, which reduces overly large seams caused by existences of chip on films when splicing, thereby improving display effect of the splicing display screen. In addition, a first metal line technique can be compatible with position accuracy within a resolution range.

Figure 2:
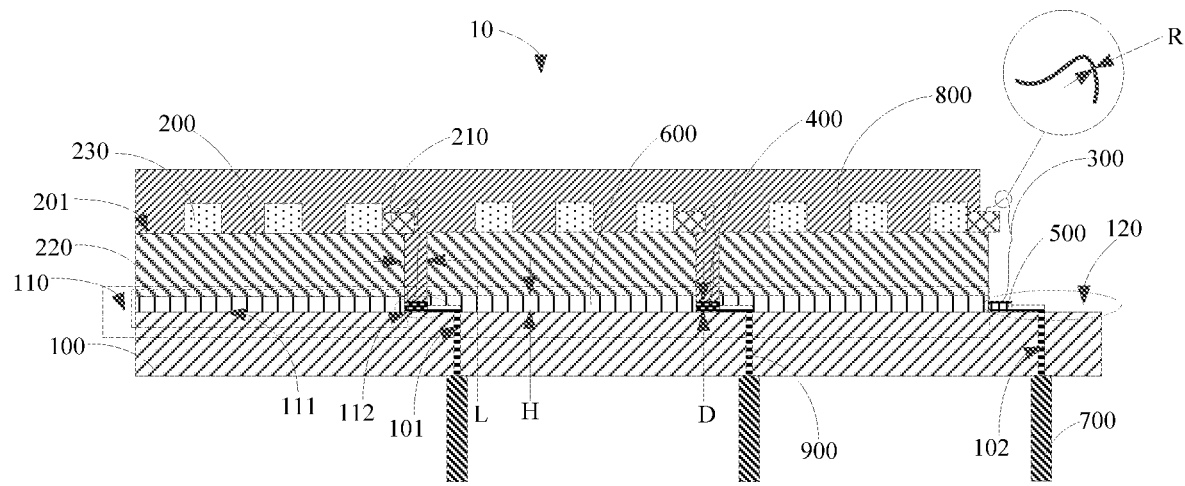
FIG. 2 is a second schematic cross-sectional structural diagram of the splicing display screen according to an embodiment of the present disclosure.

Referring to FIG. 2, FIG. 2 is a second schematic cross-sectional structural diagram of the splicing display screen according to an embodiment of the present disclosure. It should be noted that a difference between FIG. 2 and FIG. 1 is that the splicing display screen 10 in FIG. 2 further includes a plurality of second metal lines 900, via holes 101, and through-holes 102. The via holes 101 are positioned in the mounting areas 111. The through-holes 102 are positioned in the bonding area 120. The via holes 101 and the through-holes 102 penetrate through the circuit board 100. The at least one chip on film 700 is disposed at a bottom of the circuit board 100. The second metal lines 900 are disposed on the circuit board 100 and in the via holes 101. The first metal parts 400 are electrically connected to the at least one chip on film 700 at the bottom of the circuit board 100 by the second metal lines 900. In the bonding area 120, the second metal lines 900 are disposed on the circuit board 100 and in the through-holes 102. The second metal parts 500 are electrically connected to the at least one chip on film 700 at the bottom of the circuit board 100 by the second metal lines 900. Other structures are shown in FIG. 1, which will not be iterated herein for the sake of conciseness.

In the present disclosure, the first metal parts are electrically connected to the metal connection pads on the display panels by the first metal lines, drive signals are input into planes, and the at least one chip on film is electrically connected to the first metal parts and the second metal parts by the second metal lines to drive the display panels to work normally, which prevents voltage drops caused by overly long circuits and reduces overly large seams caused by existences of chip on films when splicing, thereby improving display effect of the splicing display screen and saving costs. In addition, the first metal line technique can be compatible with position accuracy within the resolution range.

Figure 3:
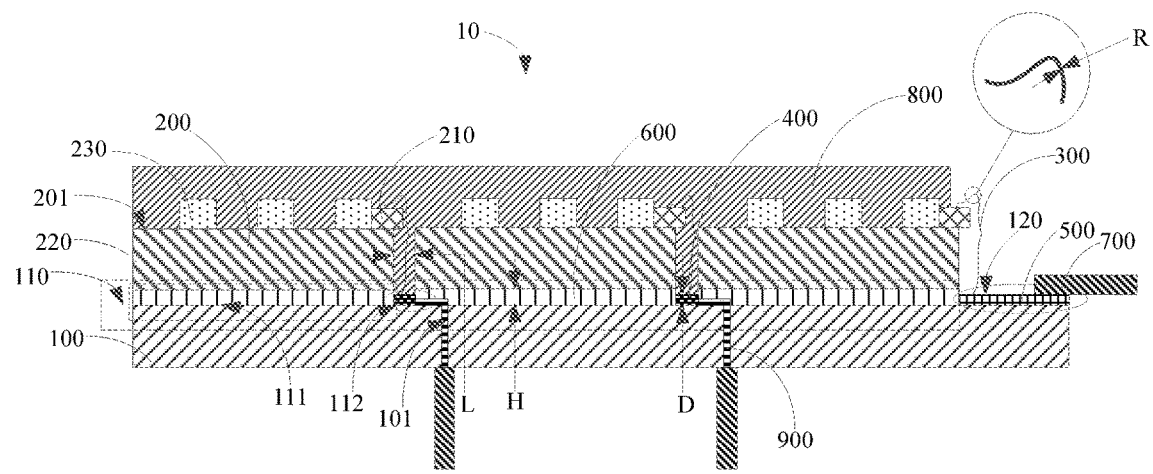
FIG. 3 is a third schematic cross-sectional structural diagram of the splicing display screen according to an embodiment of the present disclosure.

Referring to FIG. 3, FIG. 3 is a third schematic cross-sectional structural diagram of the splicing display screen according to an embodiment of the present disclosure. It should be noted that a difference between FIG. 3 and FIG. 2 is that in FIG. 3, in the bonding area 120, there is no hole-opening design, and the chip on film 700 is not disposed at the bottom of the circuit board 100 but is directly electrically connected to the second metal parts 500. No hole-opening design can further reduce production cost.

Figure 4:
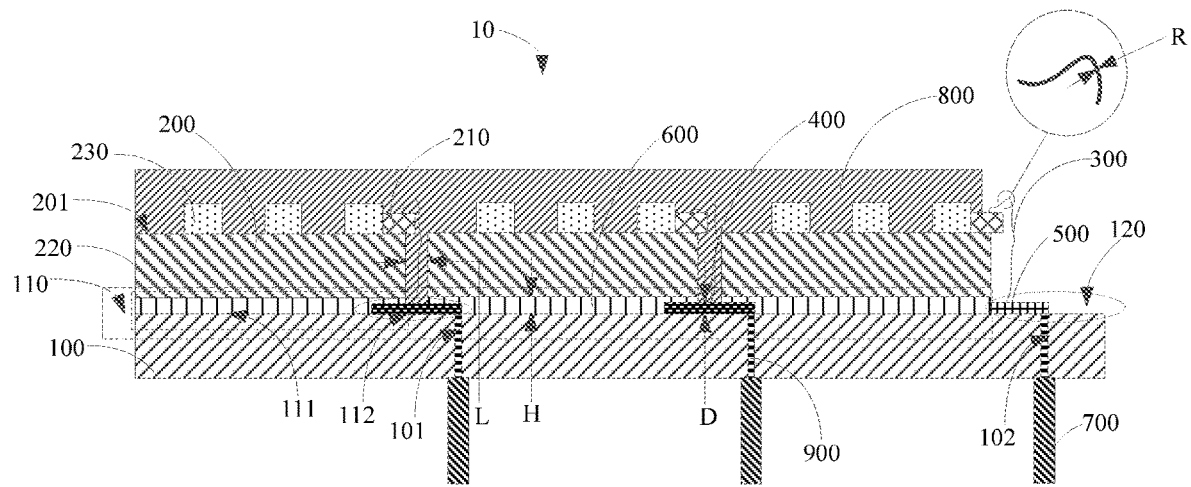
FIG. 4 is a fourth schematic cross-sectional structural diagram of the splicing display screen according to an embodiment of the present disclosure.

Referring to FIG. 4, FIG. 4 is a fourth schematic cross-sectional structural diagram of the splicing display screen according to an embodiment of the present disclosure. It should be noted that a difference between FIG. 4 and FIG. 2 is that in FIG. 4, the second metal lines 900 are directly filled in the via holes 101 and the through-holes 102, and are electrically connected to the at least one chip on film 700 at the bottom of the circuit board 100. This further prevents voltage drops caused by overly long circuits and reduces overly large seams caused by existences of chip on films when splicing, thereby improving the display effect of the splicing display screen and saving costs. In addition, the first metal line technique can be compatible with position accuracy within the resolution range.

The present disclosure provides the splicing display screen. The splicing display screen includes the circuit board, the plurality of display panels, and the plurality of first metal lines. The circuit board includes the plurality of circuit areas, and each of the circuit areas includes one of the mounting areas and one of the electrical connection areas. The plurality of first metal parts are disposed in the electrical connection areas. The display panels are disposed on the circuit board and positioned in the mounting areas, each of the display panels includes one of the metal connection pads disposed on the display surface of each of the display panels, and the metal connection pads are electrically connected to the first metal parts by the first metal lines. Gaps of seams can be reduced by the first metal lines electrically connecting the metal connection pads on the display panels to the first metal parts on the circuit board, thereby improving the display effect of the splicing display screen.

The embodiments of the present disclosure are described in detail above. Specific examples are used herein to explain the principles and implementation of the present disclosure. The descriptions of the above embodiments are only used to help understand the present disclosure. Meanwhile, for those skilled in the art, the range of specific implementation and application may be changed according to the ideas of the present disclosure. In summary, the content of the specification should not be construed as causing limitations to the present disclosure.

What is claimed is:

1. A splicing display screen, comprising:
a circuit board having a plurality of circuit areas, wherein each of the circuit areas comprises one of mounting areas and one of electrical connection areas, and a plurality of first metal parts are disposed in the electrical connection areas;
a plurality of display panels disposed on the circuit board and positioned in the mounting areas, wherein each of the display panels comprises one of metal connection pads disposed on a display surface of each of the display panels;
a plurality of first metal lines, wherein the metal connection pads are electrically connected to the first metal parts by the first metal lines;
a plurality of via holes penetrating through the circuit board and exposing the display panels, wherein the via holes are positioned in the mounting areas;
at least one first chip on film disposed on one side of the circuit board away from the display panels; and
a plurality of second metal lines disposed in the via holes, wherein the second metal lines are electrically connected to the first metal parts and the at least one first chip on film.

2. The splicing display screen according to claim 1, further comprising a plurality of adhesive parts disposed in the mounting areas of the circuit board and attached between the circuit board and the display panels.

3. The splicing display screen according to claim 2, wherein a thickness of the adhesive parts ranges from 100 μm to 200 μm.

4. The splicing display screen according to claim 1, wherein the circuit board further comprises a bonding area disposed on one side of the circuit board, and a plurality of second metal parts are disposed in the bonding area.

5. The splicing display screen according to claim 4, further comprising at least one second chip on film bonded in the bonding area and electrically connected to the second metal parts.

6. The splicing display screen according to claim 1, further comprising a sealing layer covering the circuit board, the display panels, the first metal parts, and the first metal lines.

7. The splicing display screen according to claim 1, wherein a distance between two of the display panels adjacent to each other ranges from 7 μm to 50 μm.

8. The splicing display screen according to claim 1, wherein each of the display panels comprises a substrate and a plurality of light-emitting diodes disposed on the substrate.

9. The splicing display screen according to claim 1, wherein a thickness of the first metal parts ranges from 0.2 μm to 0.5 μm.

10. The splicing display screen according to claim 1, wherein a diameter of the first metal lines ranges from 1 μm to 49 μm.

11. The splicing display screen according to claim 1, further comprising a plurality of through-holes penetrating through the circuit board, wherein the through-holes are positioned in the bonding area.

12. The splicing display screen according to claim 11, further comprising a plurality of second metal lines disposed on the circuit board and in the through-holes, wherein the second metal lines are electrically connected to the second metal parts and the at least one chip on film.

13. A splicing display screen, comprising:
a circuit board having a plurality of circuit areas, wherein each of the circuit areas comprises one of mounting areas and one of electrical connection areas, and a plurality of first metal parts are disposed in the electrical connection areas;
a plurality of display panels disposed on the circuit board and positioned in the mounting areas, wherein each of the display panels comprises one of metal connection pads disposed on a display surface of each of the display panels;
a plurality of first metal lines, wherein the metal connection pads are electrically connected to the first metal parts by the first metal lines; and
a plurality of via holes penetrating through the circuit board and exposing the display panels, wherein the via holes are positioned in the mounting areas.

14. The splicing display screen according to claim 13, further comprising a plurality of adhesive parts disposed in the mounting areas of the circuit board and attached between the circuit board and the display panels.

15. The splicing display screen according to claim 13, wherein the circuit board further comprises a bonding area disposed on one side of the circuit board, and a plurality of second metal parts are disposed in the bonding area.

16. The splicing display screen according to claim 15, further comprising at least one chip on film bonded in the bonding area and electrically connected to the second metal parts.

17. The splicing display screen according to claim 13, further comprising a sealing layer covering the circuit board, the display panels, the first metal parts, and the first metal lines.

18. The splicing display screen according to claim 13, wherein a distance between two of the display panels adjacent to each other ranges from 7 μm to 50 μm.

19. The splicing display screen according to claim 13, wherein each of the display panels comprises a substrate and a plurality of light-emitting diodes disposed on the substrate.

20. The splicing display screen according to claim 14, wherein a thickness of the adhesive parts ranges from 100 μm to 200 μm.

* * * * *